US010429750B2

(12) United States Patent
Sanchez-Fabres Cobaleda et al.

(10) Patent No.: US 10,429,750 B2
(45) Date of Patent: Oct. 1, 2019

(54) ALIGNMENT MARK RECOVERY METHOD AND LITHOGRAPHIC APPARATUS

(71) Applicant: ASML NETHERLANDS B.V., Veldhoven (NL)

(72) Inventors: Cayetano Sanchez-Fabres Cobaleda, Eindhoven (NL); Sanjaysingh Lalbahadoersing, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/323,123

(22) PCT Filed: Jun. 30, 2017

(86) PCT No.: PCT/EP2017/066267
§ 371 (c)(1),
(2) Date: Feb. 4, 2019

(87) PCT Pub. No.: WO2018/028880
PCT Pub. Date: Feb. 15, 2018

(65) Prior Publication Data
US 2019/0171120 A1    Jun. 6, 2019

(30) Foreign Application Priority Data

Aug. 10, 2016  (EP) .................................... 16183603

(51) Int. Cl.
*G03B 27/42*    (2006.01)
*G03B 27/32*    (2006.01)
(Continued)

(52) U.S. Cl.
CPC ............ *G03F 9/7084* (2013.01); *G03F 9/708* (2013.01); *G03F 9/7076* (2013.01);
(Continued)

(58) Field of Classification Search
CPC ... H01L 2223/54426; H01L 2223/5446; G03F 9/7076; G03F 9/7084; G03F 9/708;
(Continued)

(56) References Cited

U.S. PATENT DOCUMENTS 5,705,320 A    1/1998  Hsu et al.
5,843,600 A    12/1998 Chu et al.
(Continued)

OTHER PUBLICATIONS

International Search Report and Written Opinion issued in corresponding PCT Patent Application No. PCT/EP2017/066267, dated Oct. 27, 2017.

*Primary Examiner* — Mesfin T Asfaw
(74) *Attorney, Agent, or Firm* — Pillsbury Winthrop Shaw Pittman LLP

(57) ABSTRACT

A method for recovering alignment marks in a mark layer of a substrate, the method including providing a substrate with a mark layer covered by a resist layer; forming alignment marks in the mark layer, wherein an alignment mark is formed by: exposing the resist layer to a patterned radiation beam thereby forming an alignment pattern in the resist; forming one or more recovery marks in the mark layer, wherein a recovery mark is formed by exposing the resist layer to at least a portion of the patterned radiation beam thereby forming an alignment pattern in a mark area of the resist and subsequently exposing the mark area of the resist, each time with a shifted patterned radiation beam until a substantial part of the mark area has been exposed.

20 Claims, 5 Drawing Sheets

(51) Int. Cl.
*G03F 9/00* (2006.01)
*H01L 23/544* (2006.01)

(52) U.S. Cl.
CPC .. *H01L 23/544* (2013.01); *H01L 2223/54426* (2013.01); *H01L 2223/54453* (2013.01)

(58) Field of Classification Search
CPC ...... G03F 7/70633; G03F 1/42; G03F 9/7011; G03F 7/20; G03F 7/70141; G03F 7/7065; G03F 7/70683; G03F 7/70925; G03F 9/7046; G03F 9/7073
See application file for complete search history.

(56) References Cited

U.S. PATENT DOCUMENTS

| | | |
|---|---|---|
| 5,858,588 A | 1/1999 | Chang et al. |
| 6,184,104 B1 | 2/2001 | Tan et al. |
| 6,261,918 B1 | 7/2001 | So |
| 2009/0246709 A1 | 10/2009 | Nakasugi et al. |
| 2013/0001193 A1 | 1/2013 | Gabor et al. |
| 2016/0013069 A1 | 1/2016 | deVilliers |

ALIGNMENT MARK RECOVERY METHOD AND LITHOGRAPHIC APPARATUS

CROSS-REFERENCE TO RELATED APPLICATIONS

This application is the U.S. national phase entry of PCT patent application no. PCT/EP2017/066267, which was filed on Jun. 30, 2017, which claims the benefit of priority of European patent application no. 16183603.6, which was filed on Aug. 10, 2016, and which is incorporated herein its entirety by reference.

BACKGROUND

Field of the Invention

The present invention relates to a method for recovering alignment marks in a mark layer of a substrate after the alignment marks are obscured by subsequent process steps, a lithographic apparatus and a device manufacturing method.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The pattern transferred to a target portion may comprise alignment marks that allow successive patterns that are to be transferred to the target portion to be aligned very accurately with respect to previously transferred patterns or with respect to another reference. Alignment may be a two-step procedure in which in a first step, some of the alignment marks are found and measured for coarse substrate alignment in order to find other alignment marks on the substrate after which in a second step fine substrate alignment can be performed.

Crucial in the first step is that at least some alignment marks are detectable. However, due to subsequent processes, detecting the alignment marks may be impeded, e.g. when an opaque or reflective layer is deposited on the substrate. A solution is to deposit an additional mark layer before the obscuring layer is deposited and form recovery marks at predetermined locations in this additional mark layer with such a topology that the recovery marks are detectable in the obscuring layer. Detecting the recovery marks then allows to determine the location of the alignment marks and remove the obscuring layer at these locations. This is also called a clearout. After recovering the alignment marks, the alignment procedure can proceed.

A drawback of the additional mark layer is the fact that an additional layer needs to be deposited and processed to form the recovery marks, which recovery marks require an additional patterning device as well. Further, the recovery marks usually have as a result that the target portions next to the recovery marks may suffer from yield loss e.g. due to process defects. Hence, for a user of the lithographic apparatus the recovery of the alignment marks is not versatile and needs a lot of attention.

SUMMARY

It is desirable to provide a method for recovering alignment marks in a mark layer of a substrate after the alignment marks are obscured by subsequent process steps which is more versatile.

According to an embodiment of the invention, there is provided a method for recovering alignment marks in a mark layer of a substrate after the alignment marks are obscured by subsequent process steps, comprising the steps of:

a) providing a substrate with a mark layer covered by a resist layer;

b) forming alignment marks at predetermined locations in the mark layer, wherein an alignment mark is formed by:
exposing the resist layer to a patterned radiation beam thereby forming an alignment pattern in a mark area of the resist corresponding to the alignment mark;
forming one or more recovery marks at predetermined locations in the mark layer, wherein a recovery mark is formed by:
exposing the resist layer to at least a portion of the patterned radiation beam thereby forming an alignment pattern in the mark area of the resist;
subsequently exposing the mark area of the resist, each time with a shifted patterned radiation beam until a substantial part of the mark area has been exposed;

d) after exposure, developing the resist to remove exposed or non-exposed resist portions;

e) adjusting properties of the mark layer at the areas where the resist was removed, such that the one or more recovery marks are detectable after the subsequent process steps;

f) cleaning the mark layer by removing all resist.

According to another embodiment of the invention, there is provided a lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate; and
a control system to control operation of the lithographic apparatus, wherein the control system is configured to carry out the method according to the invention.

According to yet another embodiment of the invention, there is provided a lithographic apparatus comprising an illumination system configured to condition a radiation beam, a support constructed to support a patterning device, the patterning device being capable of imparting the radiation beam with a pattern in its cross-section to form a patterned radiation beam, a substrate table constructed to hold a substrate, a projection system configured to project the patterned radiation beam onto a target portion of the substrate, and a control system to control operation of the lithographic apparatus, wherein the control system is configured to carry out a method according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
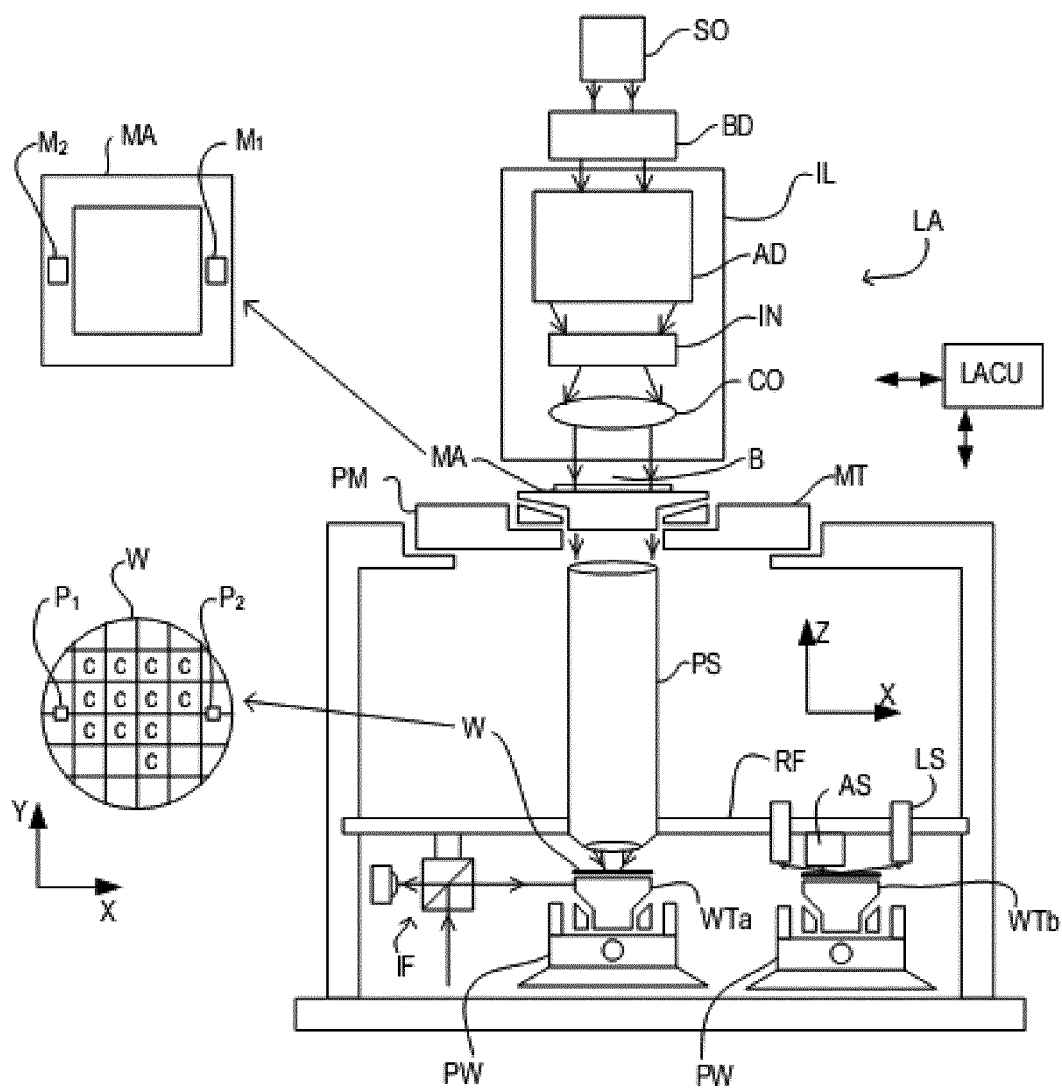
FIG. 1 depicts a lithographic apparatus according to an embodiment of the invention.

FIG. 1 schematically depicts a lithographic apparatus according to one embodiment of the invention. The apparatus comprises:
an illumination system (illuminator) IL configured to condition a radiation beam B (e.g. UV radiation or EUV radiation).
a support structure (e.g. a mask table) MT constructed to support a patterning device (e.g. a mask) MA and connected to a first positioner PM configured to accurately position the patterning device in accordance with certain parameters;
a substrate table (e.g. a wafer table) WTa or WTb constructed to hold a substrate (e.g. a resist-coated wafer) W and connected to a second positioner PW configured to accurately position the substrate in accordance with certain parameters; and
a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, and/or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate W. It should be noted that the pattern imparted to the radiation beam may not exactly correspond to the desired pattern in the target portion of the substrate W, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "radiation" and "beam" used herein encompass all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of 5-20 nm), as well as particle beams, such as ion beams or electron beams.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illuminator IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam is passed from the radiation source SO to the illuminator IL with the aid of a beam delivery system BD comprising, for example, suitable directing mirrors and/or a beam expander. In other cases the source may be an integral part of the lithographic apparatus, for example when the source is a mercury lamp. The radiation source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks M1, M2 may be located between the dies.

The depicted apparatus can at least be used in scan mode, in which the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de)-magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In addition to the scan mode, the depicted apparatus could be used in at least one of the following modes:

1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

FIGS. 2-8 depicts various steps in a method for recovering alignment marks in a mark layer ML of a substrate W according to an embodiment of the invention.

Figure 2:
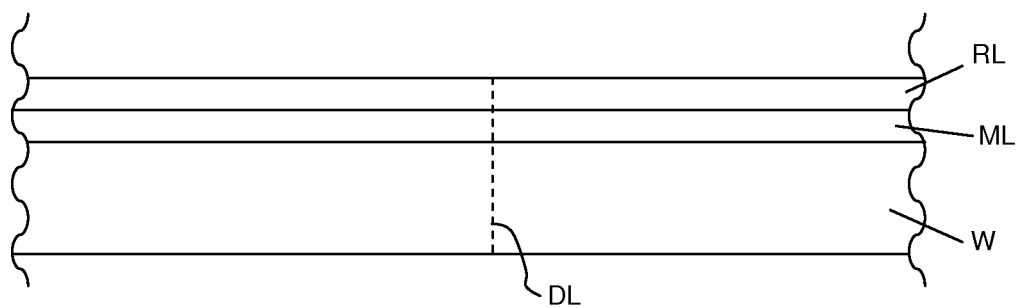
FIGS. 2-8 depict various process steps to be carried out by a control system of the lithographic apparatus of FIG. 1.

FIG. 2 is the first shown step, but many process steps may have preceded this step. However, the preceding process steps are not essential for the current invention. In the step of FIG. 2, a substrate W is provided with a mark layer ML that is covered by a resist layer RL. FIG. 2 depicts a partial cross section of the substrate W. The left half of the cross section, i.e. the left part of the dashed line DL, corresponds to a complete target portion C (see FIG. 1), where the right half of the cross section, i.e. the right part of the dashed line DL, corresponds to a dropout. A complete target portion C is a target portion having full field size that can be completely exposed and processed to deliver working devices. A dropout is an area, typically at the edge of a substrate, which is not large enough or too close to the edge to be fully exposed and/or processed. A dropout is thus outside of the set of complete target portions.

Figure 3:
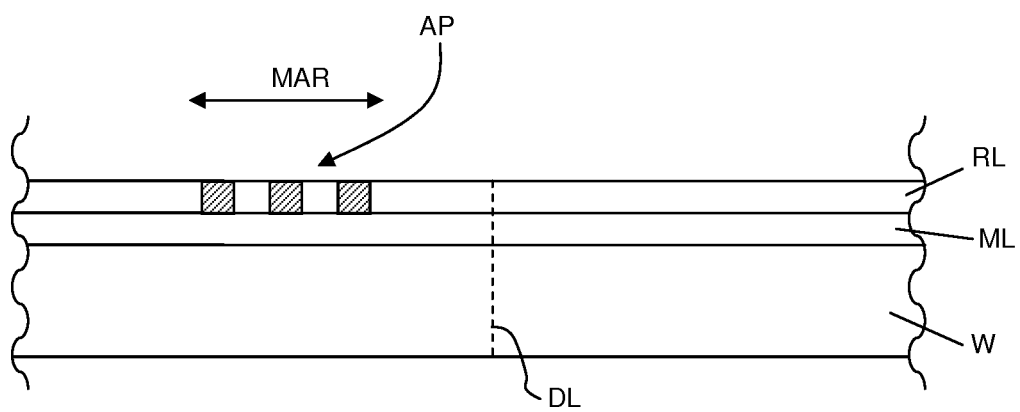

In FIG. 3, the target portions C have been exposed to a patterned radiation beam thereby forming at least an alignment pattern AP in a mark area MAR of the resist layer RL corresponding to an alignment mark. The alignment mark may for instance be formed by a set of lines, wherein each shaded block corresponds to a line in the alignment mark.

Preferably after all target portions have been exposed, the same patterning device is used to expose in one or more dropouts to form recovery marks. In the Figures only one recovery mark will be shown, but just as for the alignment mark in the target portion, it will be apparent that many more such features can be made using the same or similar process steps.

To form the recovery mark, use will be made of an already present structure in the patterned radiation beam, in this case the alignment mark. An advantage is that no additional patterning device is required to form the recovery mark. It may be preferred that the entire patterning device is bladed but for one of the alignment marks.

Figure 4:
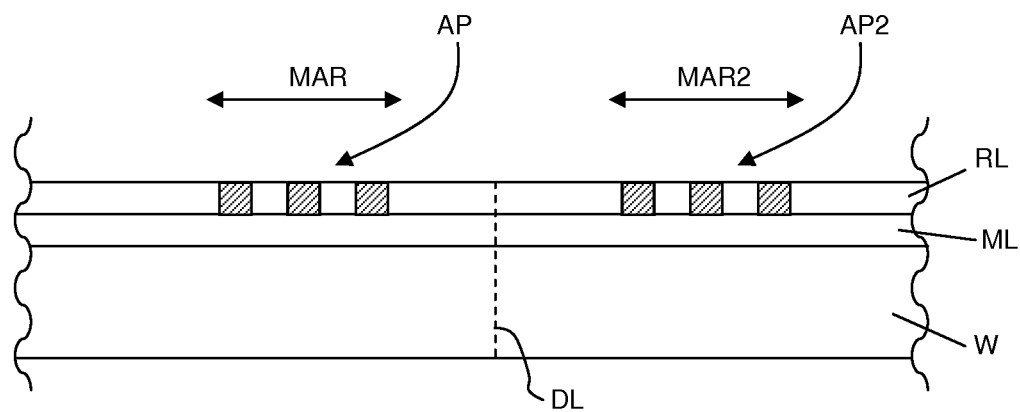
Figure 5:
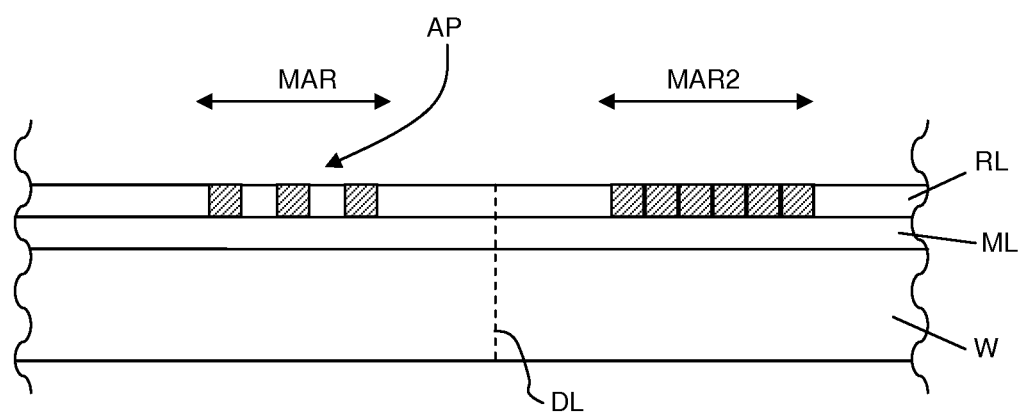

Hence, as shown in FIG. 4, the dropout area is exposed to at least a portion of the patterned radiation beam thereby forming a similar alignment pattern AP2 in a mark area MAR2 of the resist RL.

After exposing the resist layer RL in the dropout a first time, the resist layer RL is exposed again, but now with a shifted patterned radiation beam. The object of the subsequent exposures is that the entire mark area MAR2 is exposed. Hence, when the alignment pattern AP2 is a line pattern in which the thickness of the lines is equal to the spacing between the lines, the shift only needs to be the thickness of a line. Or in other words, as the alignment pattern is periodic, the shift is half a period.

In order to be sure that the entire mark area MAR2 is exposed and the two exposures slightly overlap, one or both of the exposures may be an overexposure or exposed out of focus.

Figure 6:
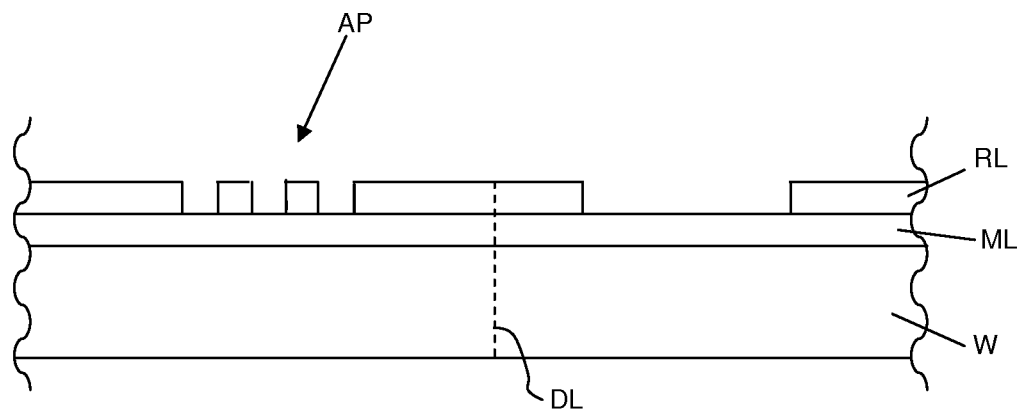
Figure 7:
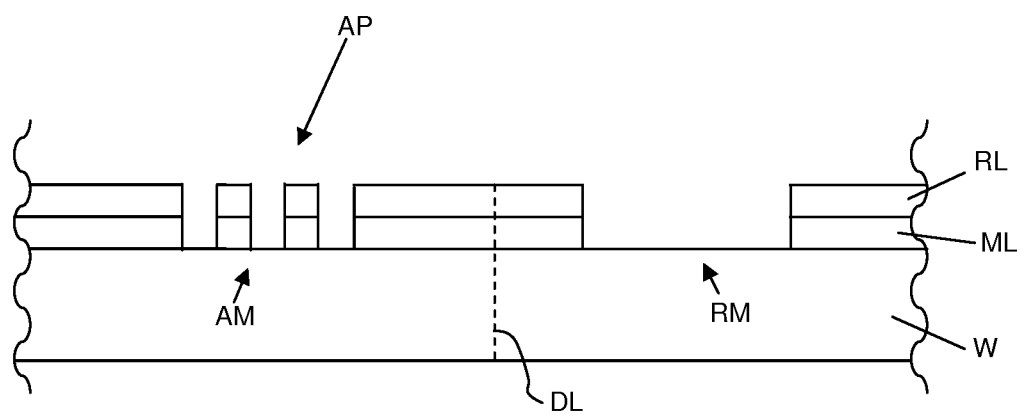

In FIG. 6, the resist is developed and the exposed areas have been removed. In FIG. 7 the mark layer is etched at the areas where the resist was removed thereby transferring the pattern in the resist layer RL to the mark layer ML and forming an alignment mark AM and a recovery mark RM.

Figure 8:
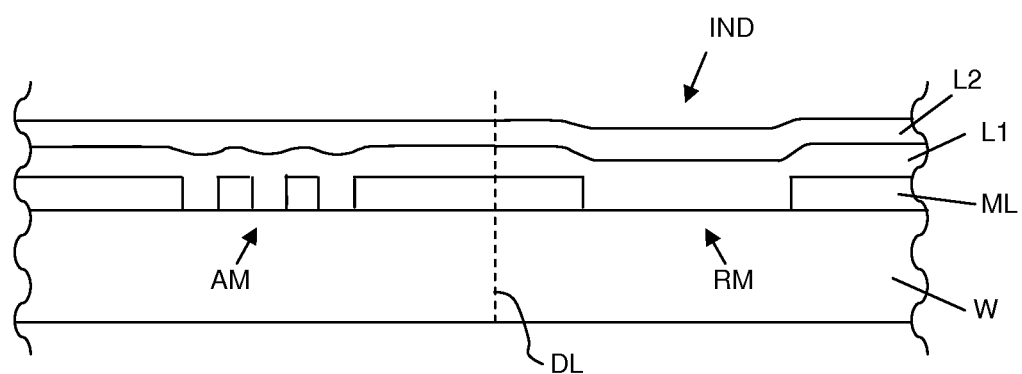

FIG. 8 depicts the substrate W after carrying out subsequent process steps. As an example, there are two layers L1, L2 deposited on top of the original mark layer ML. We assume in this example that layer L2 is obscuring the direct detection of the alignment mark AM, e.g. by being opaque or reflective. The alignment mark AM also contains too small features that this topology is visible in layer L2. However, as we created a bulk recovery mark RM, the topology is still visible in the layer L2 as an indentation IND in the layer L2.

This indentation IND can then be used to determine the location of the one or more recovery marks RM and subsequently the location of the alignment marks AM. Providing cleanout windows at the locations of the alignment marks AM can then be done in a known way to reveal the alignment marks and start aligning the substrate.

Although in the depicted example, the property of the mark layer in the areas where the resist was removed after development has been changed by etching, thereby reducing the layer thickness, it will be apparent to the skilled person that increasing the layer thickness by deposition is also possible. It is even possible that the change of property for the alignment marks is different from the change of property of the recovery marks. The alignment marks may even be formed by for instance doping the respective areas, where the recovery marks are formed by etching or deposition. In that case, two resist layers may have to be used, one resist layer for forming the alignment marks and subsequently one resist layer for forming the recovery marks.

Although the method according to the invention is shown using an alignment mark having a periodic line pattern, the invention may be used with any alignment mark. However, the type of alignment mark determines the number of shifted exposures to expose an entire mark area to form a recovery mark. Hence, in an embodiment, the number of shifted exposures may be 3, 4, or even a higher number. Further, the shifted exposures may also be in multiple directions. For instance, when the alignment mark is periodic in two directions it may be necessary to shift the exposure also in these two directions to cover the entire mark area.

In an embodiment, there is provided a method for recovering alignment marks in a mark layer of a substrate after the alignment marks are obscured by subsequent process steps, comprising: a) providing a substrate with a mark layer covered by a resist layer containing resist; b) forming alignment marks at predetermined locations in the mark layer, wherein an alignment mark is formed by exposing the resist layer to a patterned radiation beam thereby forming an alignment pattern in the mark area of the resist corresponding to the alignment mark; c) forming one or more recovery marks at predetermined locations in the mark layer, wherein a recovery mark is formed by exposing the resist layer to at least a portion of the patterned radiation beam thereby forming an alignment pattern in a mark area of the resist and subsequently exposing the mark area of the resist, each time with a shifted patterned radiation beam until a substantial part of the mark area has been exposed; after exposure, developing the resist to remove exposed or non-exposed resist portions; adjusting properties of the mark layer at the areas where the resist was removed, such that the one or more recovery marks are detectable after the subsequent process steps; and cleaning the mark layer by removing all resist.

In an embodiment, the alignment pattern is periodic in a direction, and wherein the mark area is subsequently exposed once with a patterned radiation beam that is shifted half a period in the direction. In an embodiment, the subsequent exposures to form the recovery mark are overexposed for a proper overlay with previous exposures. In an embodiment, the subsequent exposures to form the recovery mark are out of focus for a proper overlay with previous exposures. In an embodiment, the method further comprises: carrying out subsequent process steps; determining the location of the one or more recovery marks; determining the location of the alignment marks from the determined location of the one or more recovery marks; and providing cleanout windows at the determined locations of the alignment marks to reveal the alignment marks. In an embodiment, the recovery marks are formed by using only a portion of the patterned radiation beam, which portion corresponds to an alignment mark. In an embodiment, the alignment marks are made in complete target portions including one or more dies on the substrate, and wherein the one or more recovery marks are formed outside of the complete target portions. In an embodiment, adjusting properties of the mark layer includes etching of the mark layer. In an embodiment, adjusting properties of the mark layer includes increasing the layer mark layer thickness by deposition.

In an embodiment, there is provided a computer readable medium for storing computer readable code, wherein the medium comprises a computer readable code, the code causing use of a method as described herein.

In an embodiment, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate; and a control system to control operation of the lithographic apparatus, wherein the control system is configured to carry out a method as described herein.

In an embodiment, the lithographic apparatus further comprises shielding elements to shield the patterning device to allow only a portion of the patterned radiation beam to be formed, which portion corresponds to an alignment mark for the formation of the recovery marks.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for recovering an alignment mark after the alignment mark is obscured by one or more subsequent process steps, the method comprising:
    forming one or more alignment marks in a mark layer of a substrate, wherein an alignment mark of the one or more alignment marks is formed by exposing a resist covering the mark layer to a patterned radiation beam thereby forming an alignment pattern in a first mark area of the resist corresponding to the alignment mark;
    forming one or more recovery marks in the mark layer, wherein a recovery mark of the one or more recovery marks is formed by:
        exposing the resist to at least a portion of the patterned radiation beam thereby forming an alignment pattern in a second mark area of the resist, and
        subsequently exposing the second mark area of the resist, each time with a shifted patterned radiation beam until a substantial part of the second mark area has been exposed;
    after exposure of the first and second mark areas, developing the resist to remove exposed or non-exposed resist portions;
    adjusting one or more properties of the mark layer at the second mark area where the resist was removed, such that the one or more recovery marks are detectable after the one or more subsequent process steps; and
    cleaning the mark layer by removing essentially all resist.

2. The method according to claim 1, wherein the alignment pattern is periodic in a direction, and wherein the second mark area is subsequently exposed once with a patterned radiation beam that is shifted half a period in the direction.

3. The method according of claim 1, wherein one or more of the exposures to form the recovery mark are overexposed for a proper overlay with one or more other exposures to form the recovery mark.

4. The method according to claim 1, wherein one or more of the exposures to form the recovery mark are out of focus for a proper overlay with one or more other exposures to form the recovery mark.

5. The method according to claim 1, further comprising:
    carrying out subsequent process steps;
    determining the location of at least one recovery mark of the one or more recovery marks;
    determining the location of at least one alignment mark of the one or more alignment marks from the determined location of the at least one recovery mark; and
    providing one or more cleanout windows at the determined location of the at least one alignment mark to reveal the at least one alignment mark.

6. The method according to claim 1, wherein the one or more recovery marks are formed by using only a portion of the patterned radiation beam, which portion corresponds to an alignment mark of the one or more alignment marks.

7. The method according to claim 1, wherein the one or more alignment marks are made in one or more complete target portions including one or more dies on the substrate, and wherein the one or more recovery marks are formed outside of the one or more complete target portions.

8. The method according to claim 1, wherein adjusting one or more properties of the mark layer includes etching of the mark layer.

9. The method according to claim 1, wherein adjusting one or more properties of the mark layer includes increasing the layer mark layer thickness by deposition.

10. A lithographic apparatus comprising:
a support constructed to support a patterning device, the patterning device being capable of imparting a radiation beam with a pattern in its cross-section to form a patterned radiation beam;
a substrate table constructed to hold a substrate; and
a projection system configured to project the patterned radiation beam onto a target portion of the substrate; and
a control system to control operation of the lithographic apparatus, wherein the control system is configured to cause the lithographic apparatus to at least:
form one or more alignment marks in a mark layer of the substrate, wherein an alignment mark of the one or more alignment marks is formed by exposing a resist covering the mark layer to the patterned radiation beam thereby forming an alignment pattern in a first mark area of the resist corresponding to the alignment mark; and
form one or more recovery marks in the mark layer, wherein a recovery mark of the one or more recovery marks is formed by:
exposing the resist to at least a portion of the patterned radiation beam thereby forming an alignment pattern in a second mark area of the resist, and
subsequently exposing the second mark area of the resist, each time with a shifted patterned radiation beam until a substantial part of the second mark area has been exposed.

11. The lithographic apparatus according to claim 10, further comprising one or more shielding elements to shield the patterning device to allow only a portion of the patterned radiation beam to be formed, which portion corresponds to an alignment mark for the formation of the recovery marks.

12. A computer-readable medium comprising computer readable code therein, the computer readable code, when executed by a computer system, configured to cause the computer system to at least cause:
formation of one or more alignment marks in a mark layer of a substrate, wherein an alignment mark of the one or more alignment marks is formed by exposure of a resist covering the mark layer to a patterned radiation beam thereby forming an alignment pattern in a first mark area of the resist corresponding to the alignment mark; and
formation of one or more recovery marks in the mark layer, wherein a recovery mark of the one or more recovery marks is formed by:
exposure of the resist to at least a portion of the patterned radiation beam thereby forming an alignment pattern in a second mark area of the resist, and
one or more subsequent exposures of the second mark area of the resist, each time with a shifted patterned radiation beam until a substantial part of the second mark area has been exposed.

13. The computer-readable medium of claim 12, wherein the alignment pattern is periodic in a direction, and wherein the second mark area is subsequently exposed once with a patterned radiation beam that is shifted half a period in the direction.

14. The computer-readable medium of claim 12, wherein one or more of the exposures to form the recovery mark are overexposed for a proper overlay with one or more other exposures to form the recovery mark.

15. The computer-readable medium of claim 12, wherein one or more of the exposures to form the recovery mark are out of focus for a proper overlay with one or more other exposures to form the recovery mark.

16. The computer-readable medium of claim 12, wherein the one or more recovery marks are formed by using only a portion of the patterned radiation beam, which portion corresponds to an alignment mark of the one or more alignment marks.

17. The computer-readable medium of claim 12, wherein the one or more alignment marks are made in one or more complete target portions including one or more dies on the substrate, and wherein the one or more recovery marks are formed outside of the one or more complete target portions.

18. The computer-readable medium of claim 12, wherein the instructions are further configured to cause the computer system to:
after process steps having been carried on the substrate having the one or more recovery marks, determine the location of at least one recovery mark of the one or more recovery marks;
determine the location of at least one alignment mark of the one or more alignment marks from the determined location of the at least one recovery mark; and
provide one or more cleanout windows at the determined location of the at least one alignment mark to reveal the at least one alignment mark.

19. The computer-readable medium of claim 12, wherein the instructions are further configured to cause the computer system to cause:
after exposure of the first and second mark areas, development of the resist to remove exposed or non-exposed resist portions;
adjustment of one or more properties of the mark layer at the second mark area where the resist was removed, such that the one or more recovery marks are detectable after the one or more subsequent process steps; and
cleaning of the mark layer by removing essentially all resist.

20. The computer-readable medium of claim 12, wherein adjustment of one or more properties of the mark layer includes etching of the mark layer and/or increase of the layer mark layer thickness by deposition.

* * * * *